United States Patent [19]
Bennett

[11] Patent Number: 5,406,172
[45] Date of Patent: Apr. 11, 1995

[54] LIGHT SOURCE INTENSITY CONTROL DEVICE
[75] Inventor: Robert E. Bennett, Phoenix, Ariz.
[73] Assignee: Honeywell Inc., Minneapolis, Minn.
[21] Appl. No.: 174,499
[22] Filed: Dec. 28, 1993
[51] Int. Cl.⁶ ............................................. H01J 7/24
[52] U.S. Cl. .................................. 315/112; 315/116; 315/115; 315/49; 315/50
[58] Field of Search ...................... 315/48, 49, 50, 59, 315/115, 112, 116, 117; 324/721; 374/132, 137

[56] References Cited
U.S. PATENT DOCUMENTS

| | | | |
|---|---|---|---|
| 2,975,330 | 3/1961 | Bloom et al. | 315/115 |
| 4,431,947 | 2/1984 | Ferriss et al. | 315/116 X |
| 4,533,853 | 8/1985 | Hammond et al. | 315/115 X |
| 4,533,854 | 8/1985 | Northrup | 315/115 X |
| 4,955,029 | 9/1990 | Lecoy et al. | 372/31 |

Primary Examiner—Robert J. Pascal
Assistant Examiner—Haissa Philogene
Attorney, Agent, or Firm—John G. Shudy, Jr.

[57] ABSTRACT

A light source device having a controlled current source that maintains a constant intensity of light from the source during changes in light source temperature, particularly at warm-up. The light source is heated to speed up warm-up and to maintain constant temperature of the source during operation under varying ambient temperatures. Control of the current to the light source is determined by the temperature profile circuit with signals via a temperature signal conditioner from a temperature sensor proximate to the light source. Control of the heater is ultimately dictated by temperature sensor signals.

14 Claims, 8 Drawing Sheets

5,406,172

LIGHT SOURCE INTENSITY CONTROL DEVICE

FIELD OF THE INVENTION

The invention pertains to light source control and particularly to control of the intensity of the light source as the light source goes from starting temperature to operating temperature. More particularly, the invention pertains to the control of laser diode light output.

BACKGROUND OF THE INVENTION

Related art involves the light source taking several minutes to come up to the proper functioning intensity. For a given current when the light source is excited, the light source reveals an intensity that is much greater than desired for the application at hand, such as a fiber optic gyro. For the fiber optic gyro to be functioning as soon as possible, two to three minute delay is unacceptable. A satisfactory warm-up time is two to three seconds.

Conventional applications of a laser diode use automatic power control or automatic current control to regulate the light output of the diode. Automatic power control typically incorporates a back facet diode (in the same package as the laser diode) to provide a signal proportional to the output intensity of the laser diode. That signal is used to servo the signal intensity (by varying the laser diode current) to a desired level. However, automatic power control has the disadvantage of producing a change in wavelength in the output light as the current varies. That change in wavelength can cause unacceptable errors in a device such as a fiber optic gyro (FOG).

Automatic current control uses a current source to provide an essentially constant current through the laser diode. Automatic current control provides constant wavelength as long as the temperature of the diode remains constant. The disadvantage of the automatic current control is that the efficiency of a laser diode is very nonlinear with temperature. The current levels required at normal operating temperatures produce an excessive light intensity signal at low temperatures. Typically the devices are operated at some controlled temperature to minimize the intensity and wavelength variations. Conventional temperature controllers use Peltier elements to cool the devices to some temperature below the normal ambient operating temperature.

A problem with any temperature controlled laser diode circuit is achieving a usable signal while the device operating temperature is stabilizing immediately after turn-on. The efficiency of the diode (defined here as the intensity produced for a given amount current applied) is inversely proportional to the temperature of the diode. That means a laser diode operating at low temperatures but with the current required at normal temperatures will produce more intensity than the associated electronics circuitry can accommodate. Some means of reducing the current while the device is warming up, is required if the device is to function during that interval.

SUMMARY OF THE INVENTION

The present invention controls the current to the light source so that the light source has an acceptable and constant intensity as the light source warms up, in that the light intensity is appropriate within several seconds of starting the light source. An example of a light source needing intensity control is a laser diode for a fiber optic gyro.

The applicant has chosen to operate the light source with automatic current control, using a heater to maintain the temperature above its normal ambient temperature.

The intensity control circuit provides a variable drive current to the light source to compensate for the higher efficiency of the light source at lower temperatures. That higher efficiency yields excess intensity, hence potentially excess signal levels in the sensor, for a given current at start-up temperature. In an application such as the IFOG, where the light source is normally operated at a constant, elevated temperature, the control circuit provides a lower current during warm-up to ensure a prompt, usable, and non-excessive light output signal. The temperature of the light source is used to control the light source intensity during the stabilization period.

The wavelength change with temperature mentioned above occurs as this turn-on circuit is functioning. Software in a digital device using the processed light source signal may be used to compensate for that effect.

The light source assembly block contains the heater, the light source and the temperature sensor. The temperature-current profile circuit block contains the diodes and resistors used to vary the intensity with temperature. The current source consists of a voltage reference, the buffer, the MOSFET and the MOSFET source resistors.

The features of this invention include the use of the laser diode temperature to control the current through the diode, and for operating the diode at an elevated temperature.

DESCRIPTION OF THE PREFERRED EMBODIMENT

Figure 1:
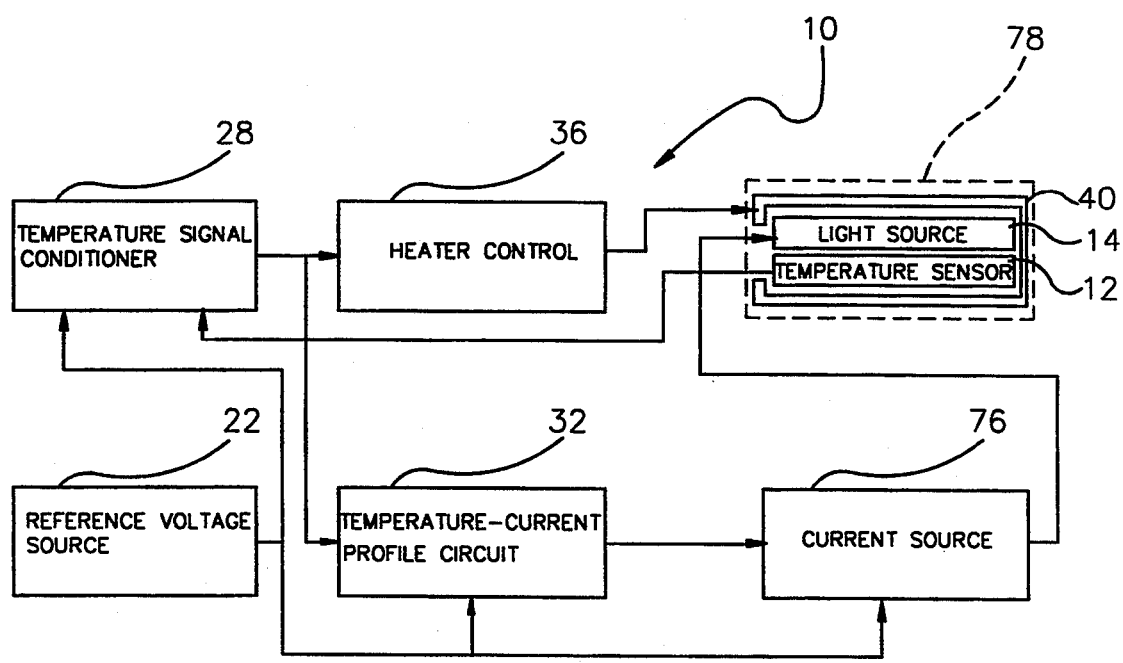
FIG. 1 is a block diagram of the light source control device.
Figure 2:
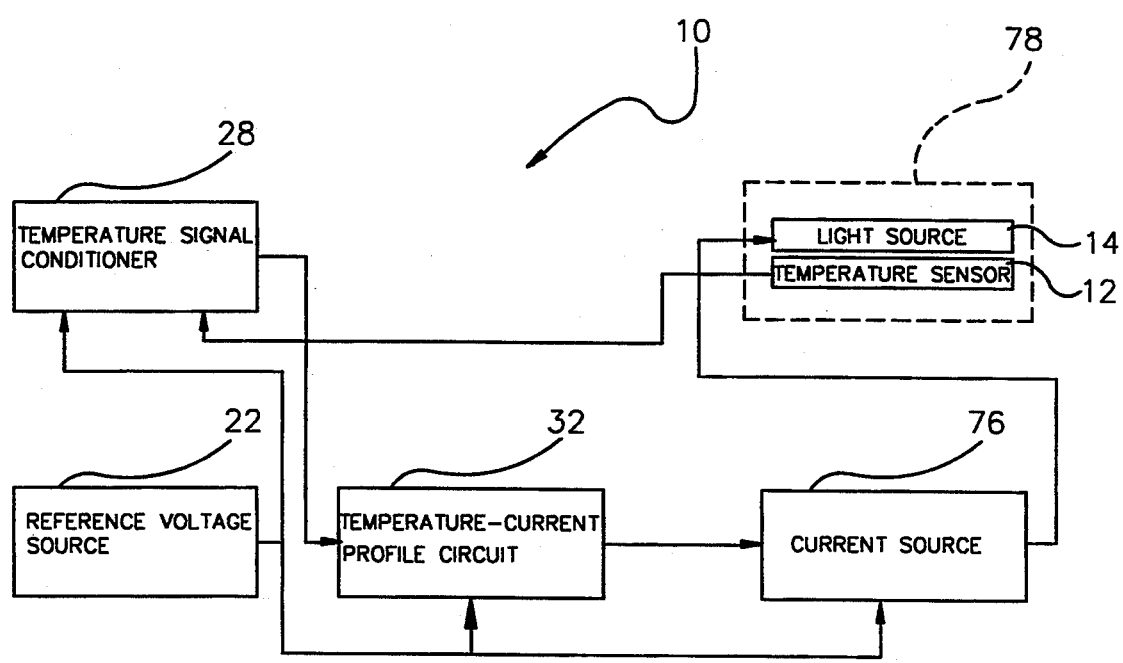
FIG. 2 is a block diagram of the source control device without a heater control circuit.

FIG. 1 shows a diagram of a light source control device 10. Temperature sensor 12 outputs an electrical temperature signal indicative of the light source 14 temperature. This electrical signal is processed by temperature signal conditioner 28. The output signal of conditioner 28 may go to heater control electronics 36 and to temperature-current profile circuit 32. However, heater control 36 is not required for the functioning of device 10. The version without heater control 36 is shown in FIG. 2. Heater control 36 provides more optimum circuit performance. Heater control 36 output sets the level of heater 40 which heats and keeps light source 14 at a certain temperature level. Light source 14 and temperature sensor 12 are housed in assembly block 78. Heater 40 is wrapped around light source 14 and sensor 12. Temperature-current profile circuit 32 outputs a control signal to current source 76 to determine the amount of current to be provided to light source 14 by current source 76. An accurate and stable voltage is provided by a reference voltage source 22 to temperature signal conditioner 28, temperature-current profile circuit 32 and current source 76. Voltage source 22 assures that the scale factors of circuits 28, 32 and 76 remain constant.

Figure 3:
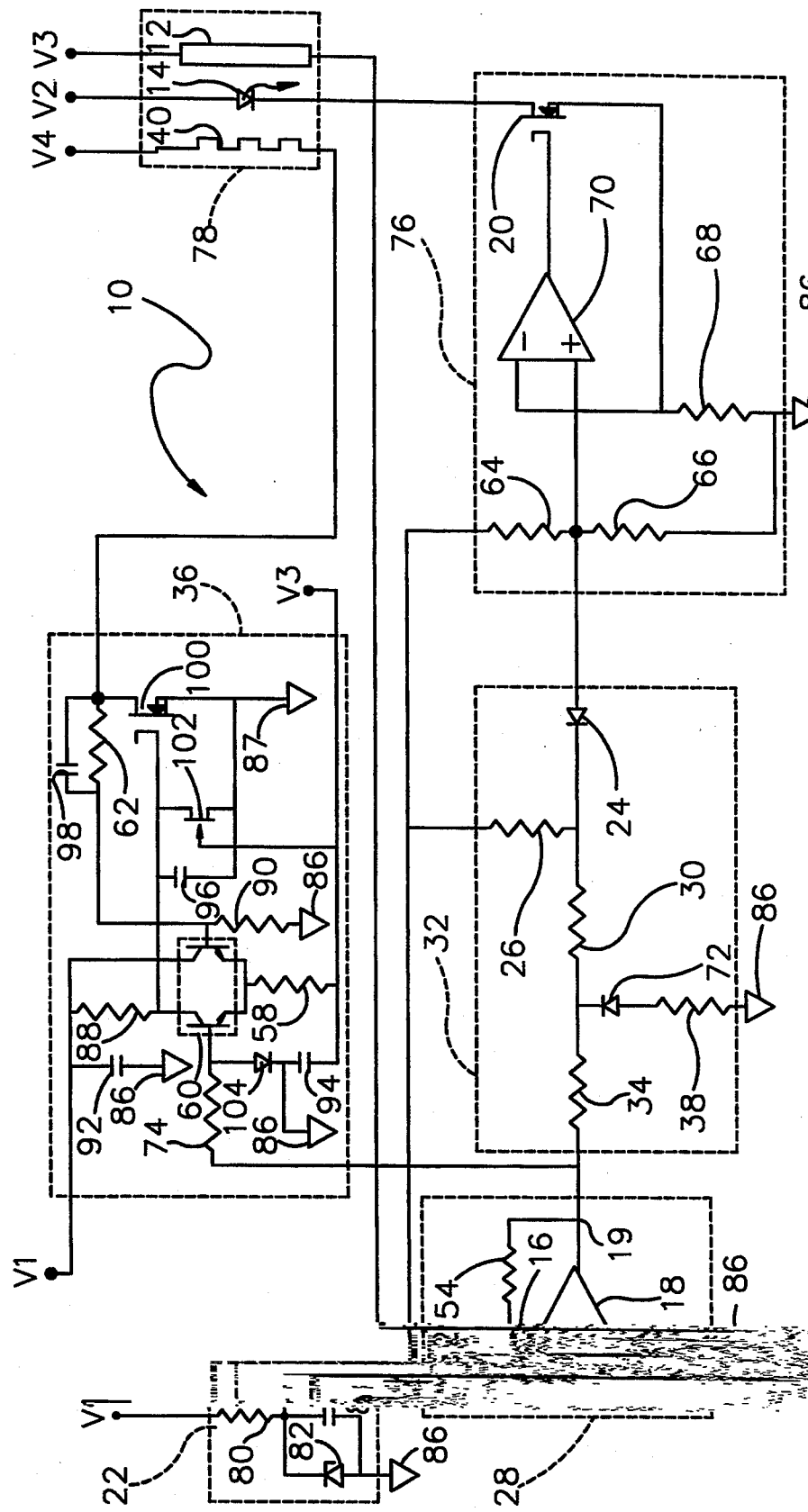
FIG. 3 is a schematic of the control circuit.
Figure 4:
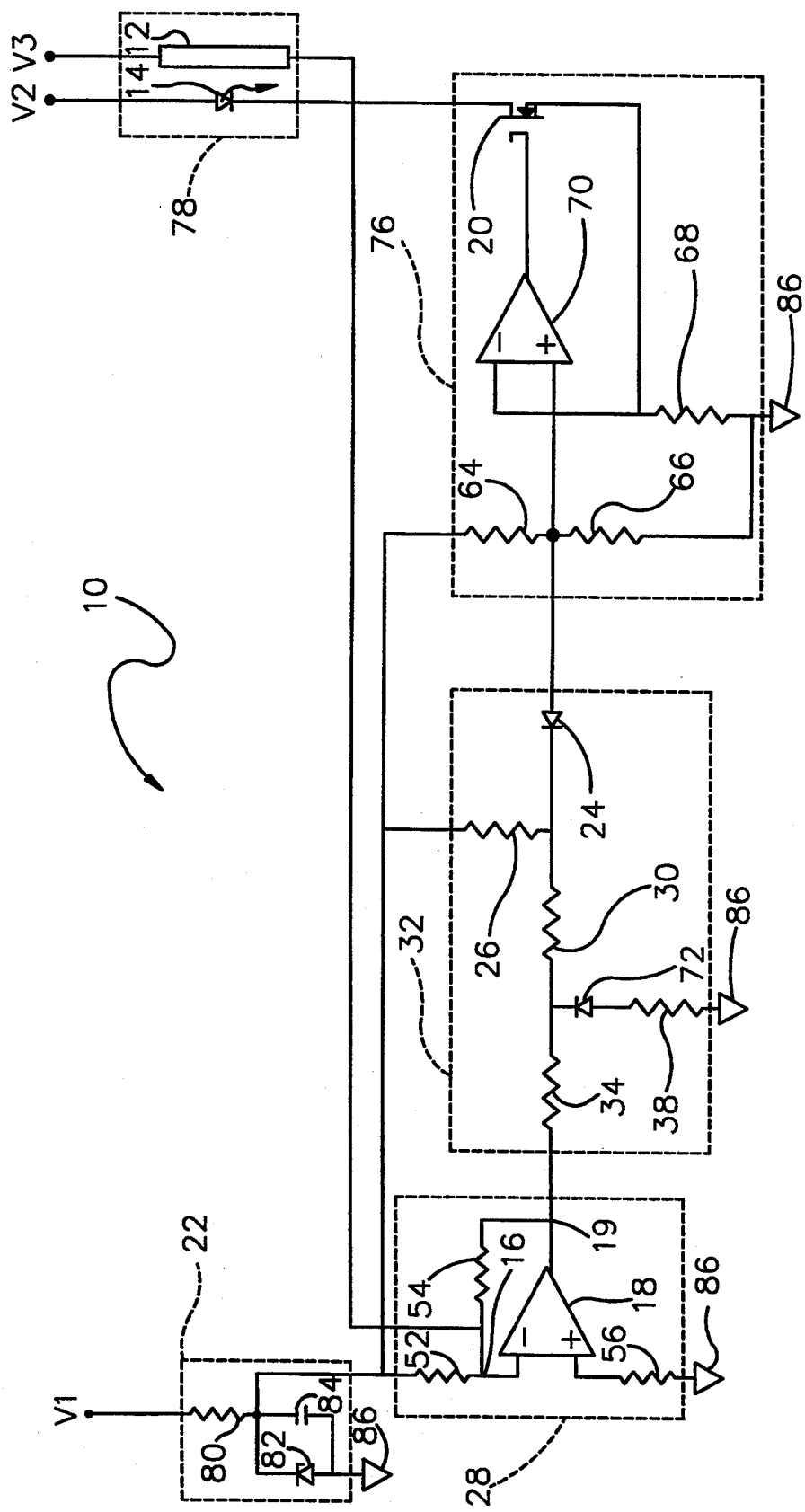
FIG. 4 is a schematic of the source control circuit without a heater control circuit.

In FIG. 3, which shows circuit 10, an ANALOG DEVICES AD590 temperature sensor 12 is mounted on light source 14 in assembly block 78 and connected to summing junction 16 of an operational amplifier 18. Temperature sensor 12 provides a signal proportional to the temperature of light source 14. Amplifier 18 converts that signal to a voltage at terminal 19 proportional to temperature, negative at low temperatures and increasingly more positive at higher temperatures. That voltage is ultimately used to modify the input voltage to a voltage follower 70 having a MOSFET buffer 20. The input voltage controls the voltage drop across the MOSFET's source resistor 68 which is selected to adjust the maximum current level to match and adjust for the particular characteristics of light source 14 and for optics losses in a device (e.g., a FOG) which incorporates source 14. Diode 14 is connected between the positive voltage V2 and the drain of MOSFET 20. The result is a fine control of the current through, and, consequently, of the intensity of light source 14 as a function of the temperature of light source 14. As light source 14 warms up, this temperature control of the current is active until the voltage across diode 24 approaches zero. Then, for higher light source 14 temperatures, diode 24 is reverse-biased and light source 14 current is held at a constant value. FIG. 4 is a schematic of circuit 10 with heater control 36 omitted.

Figure 5:
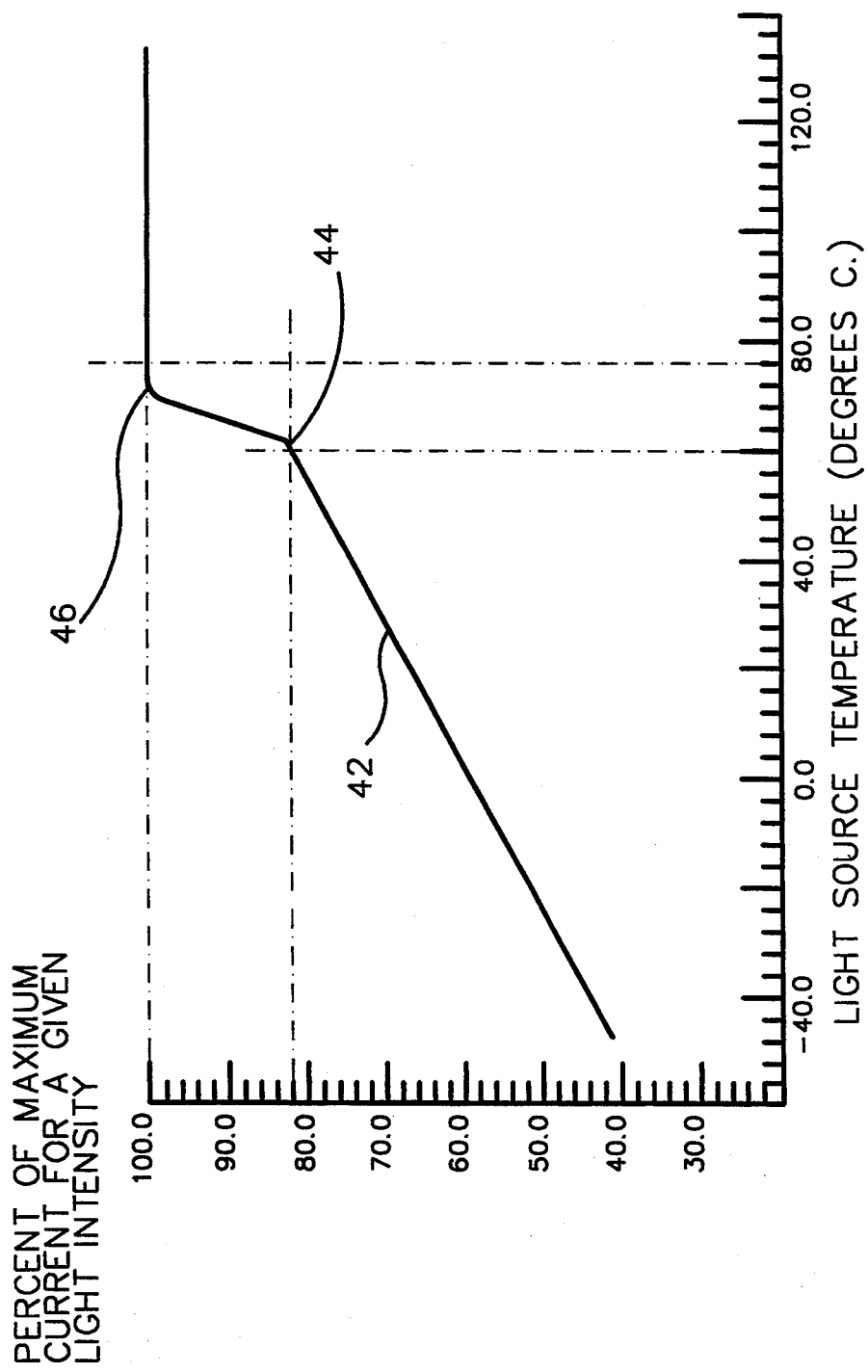
FIG. 5 is a graph showing the performance characteristic of the source control circuit.
Figure 6:
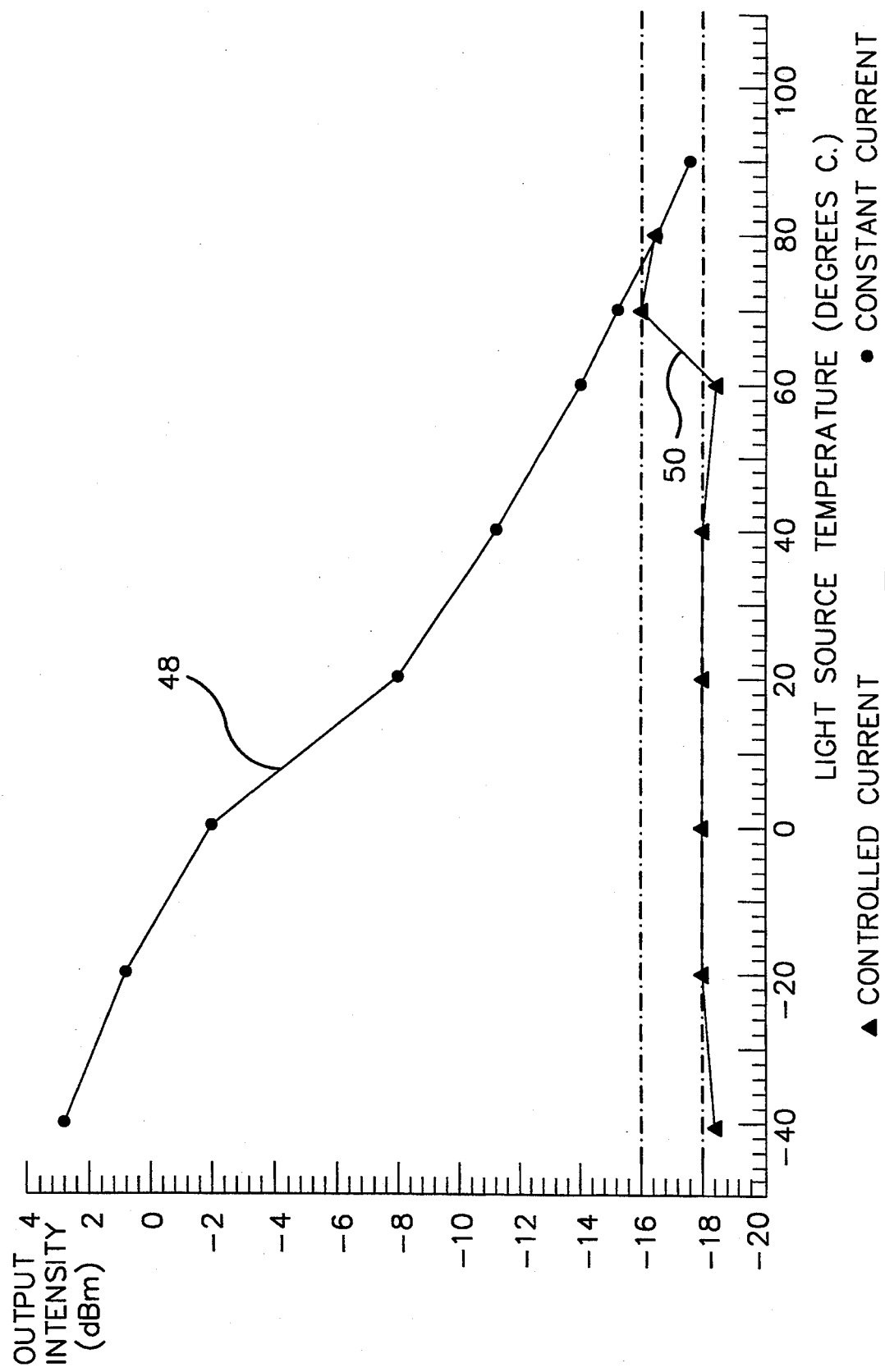
FIG. 6 shows the output intensity of the light source versus the light source temperature for the light source with the temperature compensation circuit and for the light source without the temperature compensation circuit, respectively.

FIG. 5 is a graph of the current (which is shown as a percentage of a maximum current for a given light source 14) versus temperature (of light source 14) curve 42 having knees 44 and 46, of circuit 10 in FIG. 3. Curve 42 is similar for circuit 10 in FIG. 4. Curve 42 indicates the current magnitude through light source 14. Knee 44 occurs at 60 degrees C. for an 82 percent amount of maximum current. Knee 46 occurs at 76 degrees C. for nearly 100 percent of maximum current. The performance characteristic of light source 14, as shown by curve 48 of FIG. 6, is compensated for as shown by curve 42 incorporating curve knees 44 and 46 in FIG. 5. The compensated-for intensity level of light source 14 is shown by curve 50 of FIG. 6.

Since the intensity and current characteristics of the light source 14 are not linear with temperature, circuit 10 provides a nearly constant intensity from light source 14 during warm-up, as illustrated by curve 50 of FIG. 6. Circuit 10 allows for a dual slope warm-up curve 42, with a higher intensity versus temperature gradient between a point above the coldest operating temperature and the point at which constant regulation is desired. The slopes of curve 42 and breakpoints 44 and 46 (of FIG. 5) are adjustable through component-value selection of temperature-current profile circuit 32. Diode 72 provides first knee 44 and diode 24 provides the second knee 46 in temperature-versus-intensity curve 42. The values and ratios of resistors 26, 30, 34 and 38 determine the slopes and breakpoints of warm-up curve 42, that is, the temperature-current profile. The values of resistors 26, 30, 34 and 38 are determined on a case by case situation because the nonlinear characteristics of the particular diodes 24 and 72 have an effect as to what those resistor values are to be.

FIG. 6 shows response curve 48 of a typical light source 14 assembly in an IFOG with constant current control but no temperature compensation. Response curve 50 is of a light source 14 having current control circuit 10. Curve 50 shows the light source intensity staying within +1 dB and −2 dB from a normal operating level for temperatures ranging from approximately −40 degrees Centigrade (C.) to +80 degrees C. Curve 50 stays within approximately +1 dB/−1 dB for temperatures ranging from 25 degrees C. to 85 degrees C. Curve 48 response reveals a very great change in intensity (approximately 20 dB) from a light source operated with constant current during the warm-up period.

Figure 7A:
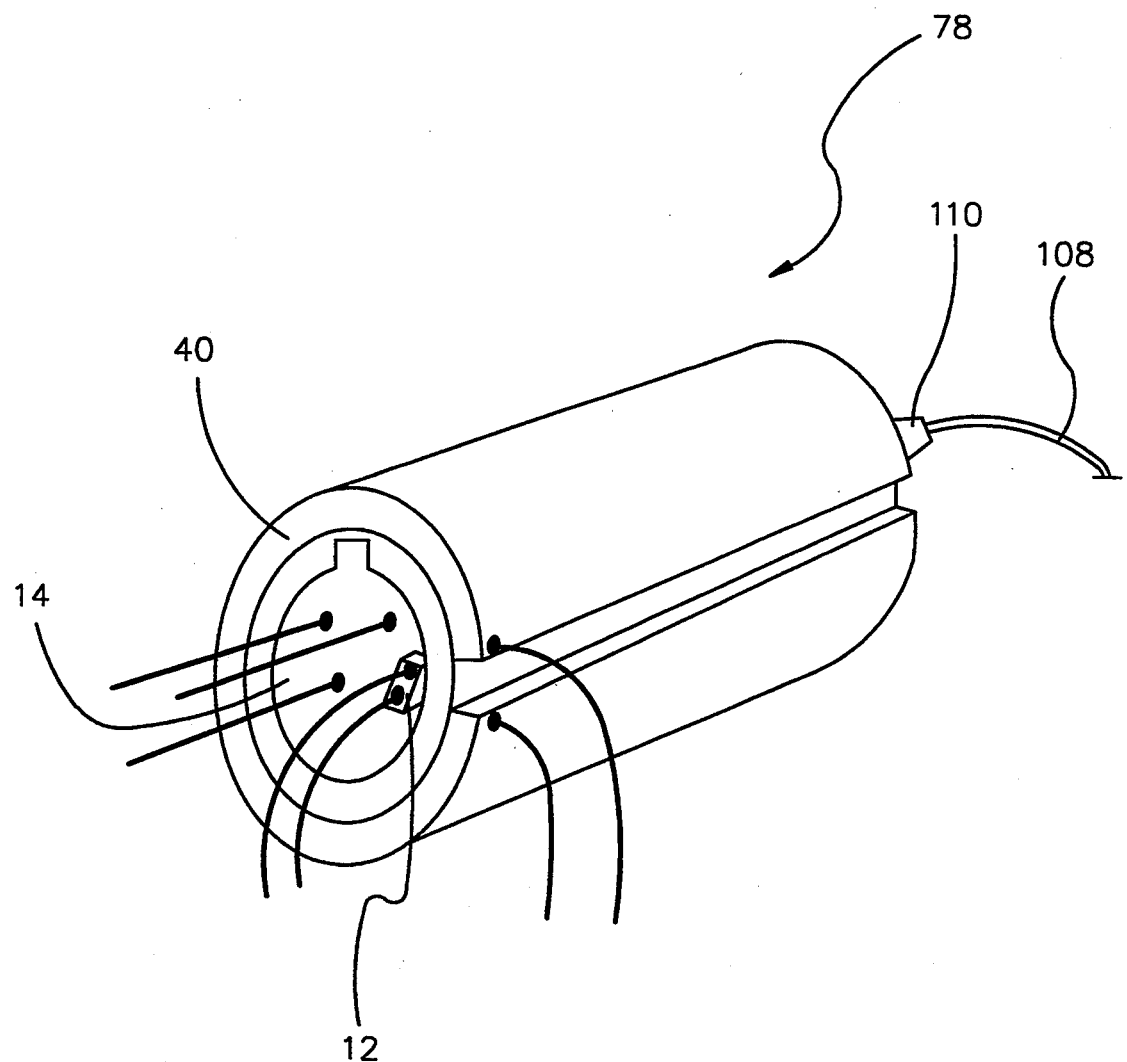
FIGS. 7a and 7b show the assembly of the light source, temperature sensor and heater.
Figure 7B:
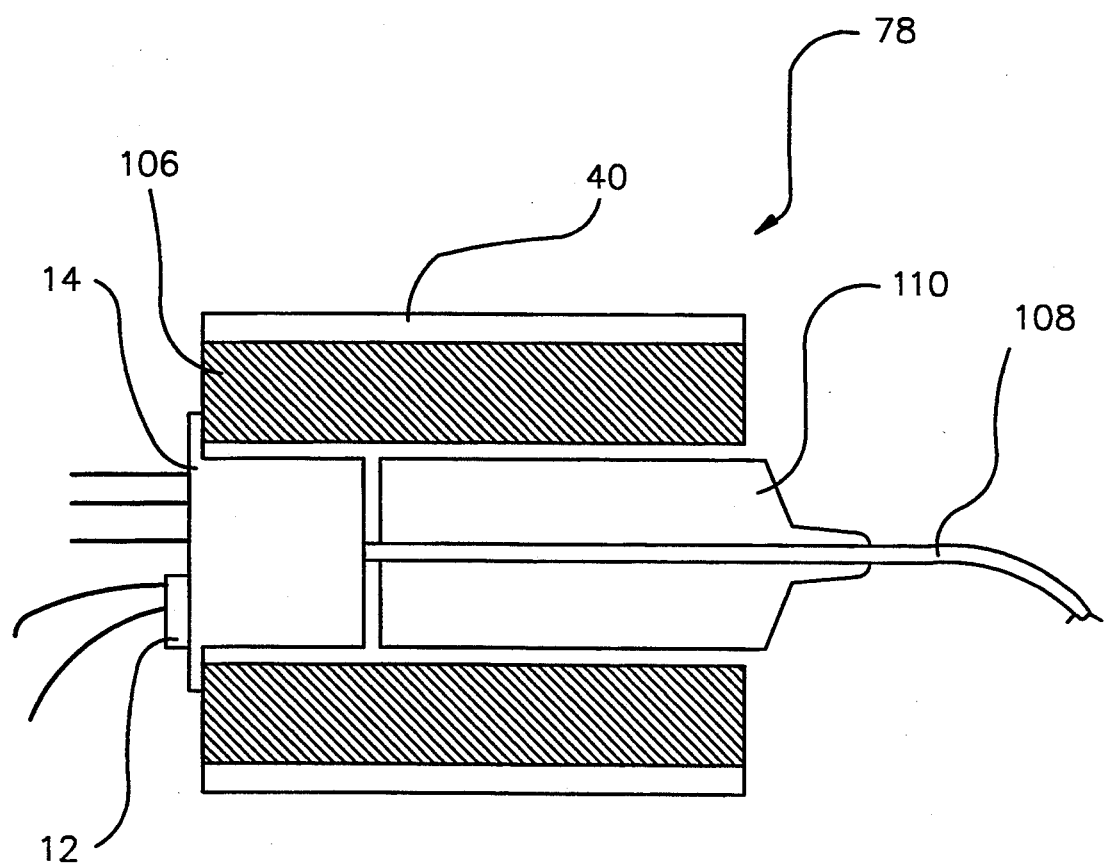

The circuit of device 10 is detailed in FIGS. 3 and 4. The structure of heater 40 of assembly 78, as shown in FIGS. 7a and 7b, is a custom made device consisting of an electrically insulated tungsten strip having a width of $\frac{3}{8}$ to $\frac{1}{2}$ inch which is wrapped around a cylinder 106 which houses light source 14 and temperature sensor 12. Cylinder 106 is about $\frac{1}{2}$ inch in diameter and about $\frac{1}{2}$ inch in length, and has a hole wherein at one end light source 14 fits, and provisions, such as support 110, fit at the other end for an optical fiber 108. Cylinder 106 is made of heat conducting material. Tungsten strip 40 is about 1.5 inches long and almost wraps completely around cylinder 106. The tungsten strip has a 110 ohm resistance and constitutes a two watt (maximum) heater. Assembly 78 is thermally insulated from its surroundings. Also, in assembly 78 is an ANALOG DEVICES model AD590 temperature sensor 12, and laser diode 14 which is model SLD202U/V made by SONY of Japan. The output signal of temperature sensor 12 goes to junction 16 which is connected to the inverting input of operational amplifier 18. Amplifier 18 is model OP470 which is made by ANALOG DEVICES of Norwood, Ma. Resistor 54, which has a value of 61.9 thousand ohms, is connected between the output at terminal 19 and the inverting input of amplifier 18. Resistor 56, having a value of 11.5 thousand ohms, connects the non-inverting input of amplifier 56 to ground or a zero voltage reference 86. Resistor 52, having a value of 14 thousand ohms, is connected between terminal 16 and a positive voltage reference 22. Resistors 52, 54 and 56, and amplifier 18 constitute temperature signal conditioner 28.

The output of conditioner 28 at terminal 19 goes through resistor 34, which has a value of 9.09 thousand ohms, and out of resistor 34 on to a terminal of resistor 30 which has a value of 11 thousand ohms. Diode 72 has a cathode connected to the common connecting terminal of resistors 30 and 34. The anode of diode 72 is connected to a terminal of resistor 38 which has a value of 1.82 thousand ohms. The other terminal of resistor 38 is connected to ground 86. The other terminal of resistor 30 is connected to the cathode of diode 24. One terminal of resistor 26, which has a value of 51.1 thousand ohms, is connected to the cathode of diode 24 and the other terminal of resistor 26 is connected to positive voltage reference 22. The anode of diode 24 is the output of temperature-current profile circuit 32, and is connected to the non-inverting input of amplifier 70, which is the input of current source 76. Resistors 26, 30, 34 and 38, and diodes 24 and 72 constitute temperature-current profile circuit 32. The resistors of circuit 10 preferably have a one percent tolerance, except that resistor 52 has a 0.1 percent tolerance.

One terminal of resistor 66 is connected to the non-inverting input of amplifier 70 and the other terminal is connected to ground 86. Resistor 66 has a value of twenty thousand ohms. Amplifier 70 is an OP470 operational amplifier. Resistor 64, which has a value of 51.1 thousand ohms, has a terminal connected to the non-inverting input of amplifier 70, and the other terminal of resistor 64 is connected to reference voltage source 22. One terminal of resistor 68 is connected to the inverting input of amplifier 70, and the other terminal of resistor 68 is connected to ground 86. Resistor 68 has a value of approximately 18 ohms. Transistor 20 is a model IRFR010 MOS N-channel field effect transistor (FET) made by INTERNATIONAL RECTIFIER of El Segundo, Calif. Transistor 20 has a drain connected to the cathode of light source diode 14, a gate connected to the output of amplifier 70, and a source connected to the inverting input of amplifier 70. The drain of transistor 20 is the output of current source 76. Resistors 64, 66 and 68, amplifier 70 and transistor 20 constitute current source 76.

A terminal of resistor 74 is the input of heater control circuit 36, and is connected to terminal 19 of the output of temperature signal conditioner 28. The other terminal of resistor 74 is connected to the base of a first transistor of dual matched NPN transistors 60. Resistor 74 has a value of ten thousand ohms. Dual matched transistors 60 constitute model SSM-2210 made by ANALOG DEVICES. Resistor 58 has a value of 255 thousand ohms, has one terminal connected to the emitters of dual matched transistors 60, and the other terminal to V3. Resistor 88 has a value of 499 thousand ohms, has one terminal connected to the collector of the first transistor of dual matched transistors 60, and the other terminal to V1. The second transistor of dual matched transistors 60 has a collector connected to V1 and a base connected to a terminal of resistor 62 which has a value of 499 thousand ohms. The other terminal of resistor 62 is connected to a first terminal of heater 40. The other terminal of heater 40 is connected to V4, which is at a positive fifteen volts. Resistor 90, which has a value of ten thousand ohms, has a terminal connected to the base of the second transistor of dual matched transistors 60, and has the other terminal connected to ground or a reference terminal 86. Diode 104 has an anode connected to the base of the first transistor of dual matched transistors 60, and a cathode connected to ground 86. Capacitor 94, which has a value of 0.068 microfarads, has one terminal connected to ground 86 and the other terminal connected to V3. Capacitor 92, which has a value of 0.068 microfarads, has one terminal connected to V1 and the other terminal connected to ground 86. Capacitor 98, which has a value of 0.068 microfarads, has one terminal connected to one terminal of resistor 62 and the other terminal connected to the other terminal of resistor 62. Transistor 102 is an N channel junction field effect transistor (JFET) which is model SMP4856 made by INTERFET. An equivalent transistor 102 can be a model 2N4856 made by various other vendors, including MOTOROLA. Transistor 102 is not required for performance reasons but provides protection to light source 14 in case of a power supply failure. Transistor 102 has a base connected to V3, a drain connected to the collector of the first transistor of dual matched transistors 60, and a source connected to ground 87. This particular ground 87 is connected in with the ground of a particular system that circuit 10 is integrated with and not to the immediate common ground 86 of circuit 10. Capacitor 96, which has a value of 0.068 microfarads, has a terminal connected the drain of transistor 102 and the other terminal connected to the source of transistor 102. An N-channel transistor 100, which is a model IRFR010 MOS N-channel field effect transistor made by INTERNATIONAL RECTIFIER, has a drain connected to the first terminal of heater 40, a gate connected to the collector of the first transistor of dual matched transistors 60, and a source connected to the same ground 87 and that the source of transistor 102 is connected to. Ground 87 is a fifteen volt return line to the signal ground of the system incorporating circuit 10.

A terminal of resistor 80 is connected to the cathode of diode 82. The anode of diode 82 is connected to ground 86. Diode 82 is a 5 volt reference integrated circuit model LM136 made by NATIONAL SEMICONDUCTOR of Santa Clara, Calif. The other terminal of resistor 80 is connected to terminal V1 which provides a positive twelve volts. A terminal of capacitor 84 is connected to the cathode of diode 82 and the other terminal of capacitor 84 is connected to ground 86. Capacitor 84 has a value of 0.068 microfarads. Resistor 80 has a value of 3.48 thousand ohms. Diode 82, capacitor 84 and resistor 80 constitute reference voltage source 22. The cathode of diode 82 is the output of reference voltage source circuit 22 and is connected to resistors 26, 52 and 64.

The anode of light source diode 14 is connected to terminal V2 which is at a voltage of an approximately positive five volts. One terminal of temperature sensor 12 is connected to the inverting input of amplifier 18. The other terminal of temperature sensor 12 is connected to terminal V3 which is at a voltage of a negative twelve volts.

I claim:

1. A intensity control device for a light source comprising:
   current means, connected to the light source, for providing current to the light source;
   sensing means, proximate to the light source, for providing an indication of temperature of the light source;
   conditioning means, for receiving the indication of the temperature of the light source, and providing a temperature indication current signal;
   heating means, proximate to the light source and connected to said conditioning means, for heating the light source in response to a magnitude of the temperature indication current signal; and
   temperature-current profiling means, connected to said conditioning means and to said current means, for receiving the temperature indication current signal and for profiling an output signal to said current means to maintain the light source at a constant intensity.

2. The control device of claim 1 further comprising reference voltage means connected to said current means, said conditioning means and said temperature-current profiling means.

3. A intensity control device for a light source comprising:
   current means, connected to the light source, for providing current to the light source;

sensing means, proximate to the light source, for providing an indication of temperature of the light source;

conditioning means, for receiving the indication of the temperature of the light source, and providing a temperature indication voltage signal; and temperature-current profiling means, connected to said conditioning means and to said current means, for receiving the temperature indication voltage signal and for profiling an output signal to said current means to maintain the light source at a constant intensity.

4. The control device of claim 3 further comprising reference voltage means connected to said current means, said conditioning means and said temperature-current profiling means.

5. A light source intensity control device comprising:
a light source;
a temperature sensor proximate to said light source;
a temperature signal conditioner connected to said temperature sensor;
a temperature-current profile circuit connected to said temperature signal conditioner;
a current source connected to said temperature-current profile circuit and to said light source;
a heater control circuit connected to said temperature signal conditioner; and
a heater, connected to said heater control circuit, proximate to said light source.

6. The control device of claim 5 further comprising a reference voltage source connected to said temperature signal conditioner, temperature-current profile circuit and current source.

7. A light source intensity control device comprising:
a laser source having an anode and a cathode
a temperature sensor, proximate to said laser diode, having first and second terminals;
a first transistor having a drain connected to the cathode of said laser source, and having a gate and a source;
a first amplifier having an output connected to the gate of said first transistor, having an inverting input connected to the source of said first transistor, and having a non-inverting input;
a first resistor having a first terminal connected to the inverting input of said first amplifier and having a second terminal;
a second resistor having a first terminal connected to the non-inverting input of said first amplifier and having a second terminal;
a third resistor having a first terminal connected to the non-inverting input of said first amplifier and having a second terminal;
a first diode, having an anode connected to the non-inverting input of said first amplifier and having a cathode;
a fourth resistor having a first terminal connected to the cathode of said first diode, and having a second terminal;
a fifth resistor having a first terminal connected to the cathode of said first diode and having a second terminal;
a second diode having a cathode connected to the second terminal of said fifth resistor and having an anode;
a sixth resistor having a first terminal connected to the anode of said second diode and having a second terminal;

a seventh resistor having a first terminal connected to the second terminal of said fifth resistor;
a second amplifier having an output connected to the second terminal of said seventh resistor and having a non-inverting input and an inverting input;
an eighth resistor having a first terminal connected to the output of said second amplifier and having a second terminal connected to the inverting input of said second amplifier;
a ninth resistor having a first terminal connected to the non-inverting input of said second amplifier and having a second terminal; and
a tenth resistor having a first terminal connected to the inverting input of said second amplifier and having a second terminal.

8. The control device of claim 7 further comprising:
a heater, proximate to said laser source, having first and second terminals;
a twelfth resistor having a first terminal connected to the output of said second amplifier and having a second terminal,
a fourth diode having an anode connected to the second terminal of said twelfth resistor and having a cathode;
a second transistor having a base connected to the second terminal of said twelfth resistor, and having a collector and an emitter;
a thirteenth resistor having a first terminal connected to the collector of said second transistor and having a second terminal;
a third transistor having a collector connected to the second terminal of said thirteenth resistor and having an emitter and a base;
a fourteenth resistor having a first terminal connected to the collectors of said second and third transistors, and having a second terminal;
a fifteenth resistor having a first terminal connected to the base of said third transistor, and having a second terminal;
a sixteenth resistor having a first terminal connected to the base of said third transistor and having second terminal; and
a fourth transistor having a drain connected to the second terminal of said sixteenth resistor and to the first terminal of said heater, having a gate connected to the first terminal of said thirteenth resistor, and having a source.

9. The control device of claim 8 further comprising:
an eleventh resistor having first terminal connected to the second terminals of said third, fourth and tenth resistors, and having a second terminal;
a third diode having a cathode connected to the first terminal of said eleventh resistor and having an anode; and
a capacitor having a first terminal connected to the first terminal of said eleventh resistor.

10. The control device of claim 7 wherein:
said first resistor has a value within 20 percent of 18 ohms;
said second resistor has a value within 20 percent of 20 thousand ohms;
said third resistor has a value within 20 percent of 51 thousand ohms;
said fourth resistor has a value within 20 percent of 50 thousand ohms;
said fifth resistor has a value within 20 percent of 11 thousand ohms;

said sixth resistor has a value within 20 percent of 1.8 thousand ohms;

said seventh resistor has a value within 20 percent of 9.1 thousand ohms;

said eighth resistor has a value within 20 percent of 62 thousand ohms;

said ninth resistor has a value within 20 percent of 11.5 thousand ohms; and said tenth resistor has a value within 20 percent of 14 thousand ohms.

11. The control device of claim 9 wherein:

said eleventh resistor has a value within 20 percent of 3.5 thousand ohms; and said capacitor has a value within 20 percent of 0.07 microfarads.

12. The control device of claim 8 wherein:

said twelfth resistor has a value within 20 percent of ten thousand ohms;

said thirteenth resistor has a value within 20 percent of 500 thousand ohms;

said fourteenth resistor has a value within 20 percent of 250 thousand ohms;

said fifteenth resistor has a value within 20 percent of ten thousand ohms; and said sixteenth resistor has a value within 20 percent of 500 thousand ohms.

13. The control device of claim 8 wherein:

the second terminals of said first, sixth, ninth and fifteenth resistors are connected to a ground reference potential;

the second terminals of said tenth and thirteenth resistors are connected to a first voltage potential;

the anode of said laser source is connected to a second voltage potential; and the second terminal of said temperature sensor and the second terminal of said fourteenth resistor are connected to a third voltage potential; and the second terminal of said heater is connected to a fourth voltage potential.

14. The control device of claim 8 wherein said first and fourth transistors are N-channel field effect transistors.

* * * * *